(12) United States Patent
Onodera et al.

(10) Patent No.: US 9,506,738 B2
(45) Date of Patent: Nov. 29, 2016

(54) ROTATION DETECTOR

(71) Applicant: ALPS ELECTRIC CO., LTD., Ota-ku, Tokyo (JP)

(72) Inventors: Takashi Onodera, Tokyo (JP); Tokuo Nakamura, Tokyo (JP); Takafumi Noguchi, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 355 days.

(21) Appl. No.: 14/296,906

(22) Filed: Jun. 5, 2014

(65) Prior Publication Data

US 2015/0061654 A1   Mar. 5, 2015

(30) Foreign Application Priority Data

Aug. 27, 2013   (JP) ................................. 2013-175240

(51) Int. Cl.
| | |
|---|---|
| *G01B 7/30* | (2006.01) |
| *G01R 33/09* | (2006.01) |
| *B60T 7/04* | (2006.01) |
| *G01D 5/14* | (2006.01) |

(52) U.S. Cl.
CPC ................. *G01B 7/30* (2013.01); *B60T 7/042* (2013.01); *G01D 5/145* (2013.01); *G01R 33/091* (2013.01)

(58) Field of Classification Search
CPC .. G01R 33/093; G01R 33/09; G01R 33/091; G01D 5/145; G01B 7/30; B60T 7/042
See application file for complete search history.

(56) References Cited

U.S. PATENT DOCUMENTS

| | | | |
|---|---|---|---|
| 6,060,969 A | 5/2000 | Hufgard et al. | |
| 8,519,700 B2 | 8/2013 | Jerance et al. | |
| 2002/0186009 A1* | 12/2002 | Makino .................. | G01D 5/145 324/207.25 |
| 2008/0272834 A1* | 11/2008 | Uemura ................. | G01D 5/145 327/544 |
| 2010/0219822 A1* | 9/2010 | Suzuki ..................... | G01D 1/00 324/252 |
| 2014/0015384 A1* | 1/2014 | Someya ............... | G01D 5/2454 310/68 B |

* cited by examiner

*Primary Examiner* — Huy Q Phan
*Assistant Examiner* — Adam Clarke
(74) *Attorney, Agent, or Firm* — Hunton & Williams LLP

(57) ABSTRACT

A rod-shaped magnet is mounted on a rotating unit. The rod-shaped magnet has end surfaces which are oriented in a rotating direction and are magnetized to different magnetic poles. An angle detecting unit including magnetoresistive elements is disposed so as to be offset in a radial direction of a revolution path of the magnet from the revolution path and is configured to detect a change in angle of rotation of the rotating unit by detecting a leakage magnetic field in the vicinity of a side surface of the magnet. Two position detecting units each include magnetoresistive elements and are configured to detect a change in orientation of a magnetic field in the direction of a tangent to the revolution path when facing the rod-shaped magnet and produce a switch output.

5 Claims, 12 Drawing Sheets

ROTATION DETECTOR

CLAIM OF PRIORITY

This application contains subject matter related to and claims the benefit of Japanese Patent Application No. 2013-175240 filed on Aug. 27, 2013, the entire contents of which is incorporated herein by reference.

BACKGROUND OF THE DISCLOSURE

1. Field of the Disclosure

The present disclosure relates to a rotation detector capable of detecting a change in angle of rotation of a rotating unit and determining whether the rotating unit has rotated to a predetermined position.

2. Description of the Related Art

Detectors detecting a moving magnet with a magnetic detecting element have been used in variety of fields.

Japanese Patent No. 5059772 discloses a magnetic angular position sensor which detects rotation of a cylindrical permanent magnet with two magnetosensitive elements.

The magnetic angular position sensor disclosed in Japanese Patent No. 5059772 includes the cylindrical permanent magnet which is attached to an outer circumferential surface of a steering column or a drive shaft. The permanent magnet is radially magnetized. The magnetosensitive elements each include at least one pair of magnetic sensors (magnetoresistive sensors) magnetically coupled by a ferromagnetic yoke which is orthogonal to the sensing axes of the sensors. The yoke is disposed in a plane orthogonal to the axis of rotation of the magnet or a plane parallel to a plane passing through the axis of rotation.

Two signals obtained by detection through the two magnetosensitive elements are subjected to decoding and standardization of two components, thus producing an electrical signal which is proportional to the angle of rotation of the magnet.

U.S. Pat. No. 6,060,969 discloses a switch including a magnet and a magnetic detecting element (magnetoresistive element).

The switch disclosed in U.S. Pat. No. 6,060,969 includes a magnetic angle sensor fastened inside a housing. The housing accommodates the magnet moving together with a switch head. The magnet moves over the magnetic angle sensor. As the magnet moves, the magnetic angle sensor detects a change in magnetic field component parallel to a moving direction in which the magnet moves and a change in magnetic field component in a direction orthogonal to the moving direction.

In general, an apparatus, like that disclosed in Japanese Patent No. 5059772, for detecting the angle of rotation of a magnet and a switch, like that disclosed in U.S. Pat. No. 6,060,969, for detecting movement of a magnet are configured as separate apparatuses. There has been no apparatus that provides both an output (hereinafter, referred to as a "rotation detection output") indicating detected rotation and an output (hereinafter, referred to as a "switch output") from a switch with a single magnet.

To produce switch outputs from two or more switch systems, any of switch detecting units has to be offset from the middle of a magnet along the width (hereinafter, also referred to as a "width direction") of the magnet. In this case, magnetic field components in different directions from the magnet are applied to the switch detecting units, so that noises of the magnetic field components other than the magnetic field components to be detected in target directions tend to be superimposed on the detected magnetic field components in the target directions. Disadvantageously, it is difficult to yield high-precision switch outputs.

These and other drawbacks exist.

SUMMARY OF THE INVENTION

Embodiments of the present disclosure are intended to overcome the above-described disadvantages and provide a rotation detector capable of producing both a rotation detection output and a switch output indicating a detected position with a single magnet.

The various embodiments further provide a rotation detector capable of producing a high-precision switch output which is less affected by noise if a position detecting unit is offset from the middle of a magnet in the width direction of the magnet.

The various embodiments also provide a rotation detector including a rotating unit, a magnet disposed on the rotating unit, an angle detecting unit configured to detect a change in angle of rotation of the rotating unit by detecting a leakage magnetic field from the magnet, and at least one position detecting unit configured to operate when the magnet reaches a predetermined position. The magnet has two end surfaces that are away from a rotation axis of the rotating unit and are oriented in a rotating direction and are magnetized to different magnetic poles, and has a flat surface parallel to a rotation plane including a rotation path of the rotating unit. The angle detecting unit is disposed away from a revolution path of the magnet in a radial direction of the revolution path. The angle detecting unit includes a magnetoresistive element including a free magnetic layer. A direction in which magnetization of the free magnetic layer changes is set so as to be parallel to the rotation plane. The magnetoresistive element is operable to detect a change in angle of rotation of the rotating unit. The at least one position detecting unit is disposed away from the flat surface of the magnet in a direction parallel to the rotation axis of the rotating unit and includes a magnetoresistive element and a switch circuit. The magnetoresistive element has a resistance that depends on a change in intensity of a magnetic field component parallel to a direction of a tangent to the revolution path. The magnetic field component is included in a leakage magnetic field in the vicinity of the flat surface of the magnet. The switch circuit is configured to produce a switch output based on a change in the resistance.

The rotation detector according to the present disclosure can produce a detection output based on a change in angle of rotation and a switch output indicating a detected rotation position on the basis of a leakage magnetic field from the single magnet disposed on the rotating unit.

In the rotation detector according to embodiments of the present disclosure, the at least one position detecting unit may include a plurality of position detecting units. The magnetoresistive elements included in the position detecting units may be arranged so as to be offset in the radial direction from a center line that divides a width of the magnet into two halves in the radial direction.

The rotation detector according to embodiments of the present disclosure includes the magnet having the end surfaces which are oriented in the rotating direction and are magnetized to the different magnetic poles. Although the magnetoresistive elements of the position detecting units which are offset in the radial direction from the center line of the magnet, an error in position detection is reduced.

In the rotation detector according to embodiments of the present disclosure, the magnet may be a rod-shaped rectangular magnet that has side surfaces along long sides and end surfaces along short sides and has a uniform thickness. The end surfaces may be magnetized to different magnetic poles. A longitudinal direction of the magnet may be oriented in the direction of the tangent to the revolution path.

In the rotation detector according to embodiments of the present disclsoure, the at least one position detecting unit may include two position detecting units. The position detecting units may simultaneously produce switch outputs when the rotating unit rotates by a predetermined angle.

In the rotation detector according to embodiments of the present disclosure, the angle detecting unit may detect an amount of pressing a brake pedal of a motor vehicle, one of the switch outputs of the two position detecting units may be used to perform control for turning on a brake light, and the other one of the switch outputs may be used to perform control for releasing cruise control.

DESCRIPTION OF THE PREFERRED EMBODIMENTS

The following description is intended to convey a thorough understanding of the embodiments described by providing a number of specific embodiments and details involving an rotation detector. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1A:
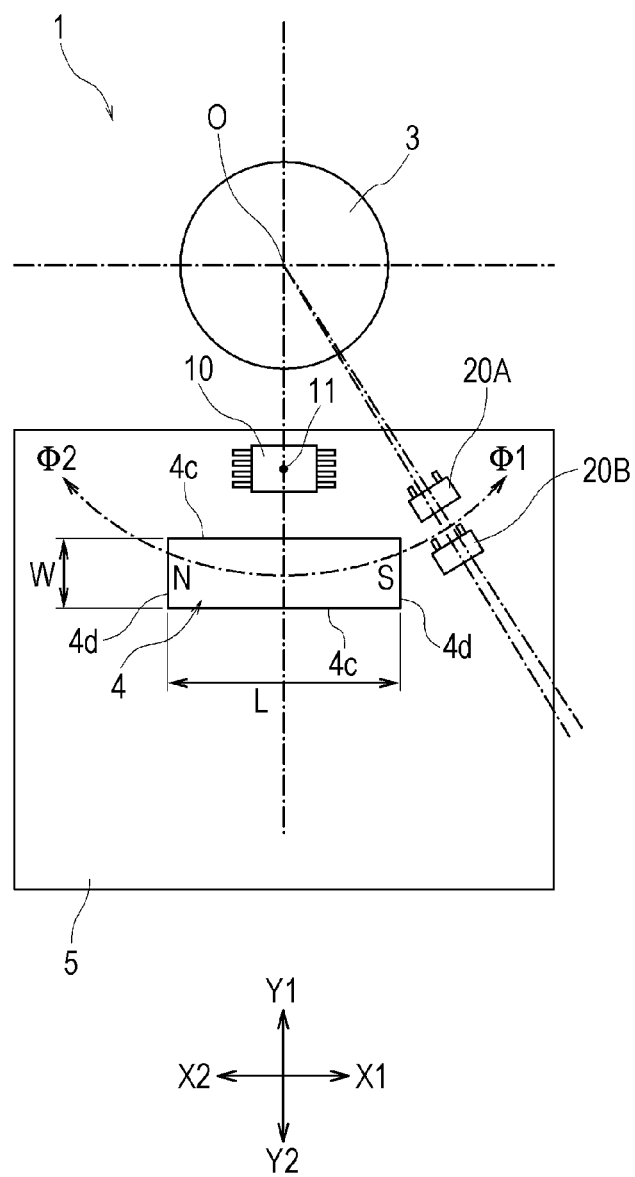
FIG. 1A is a front view of a rotation detector according to an embodiment of the present invention.
Figure 1B:
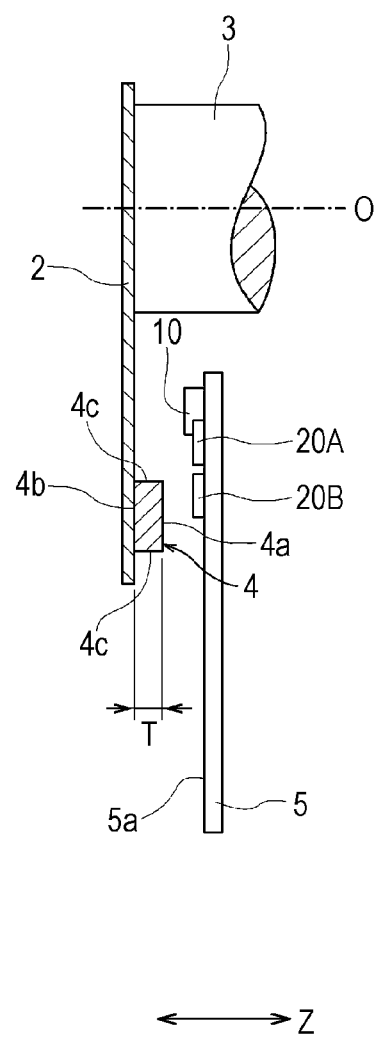
FIG. 1B is a side view of the rotation detector as seen from the right-hand side of FIG. 1A.

A rotation detector 1 may include a rotating unit 2 as illustrated in FIG. 1B. The rotating unit 2 may be fastened to a rotary shaft 3. The rotating unit 2 and the rotary shaft 3 may rotate about a rotation axis O.

The rotation detector 1 may be installed in, for example, a motor vehicle or any other like device having a brake pedal. The rotary shaft 3 may be coupled to a brake pedal. When the brake pedal is pressed, the rotary shaft 3 and the rotating unit 2 may rotate by an angle depending on the amount of pressing the brake pedal.

A magnet 4 may be fastened to the rotating unit 2. The magnet 4 may be rod-shaped and may have a flat facing surface 4a and a flat mounting surface 4b such that the facing surface 4a is opposite and parallel to the mounting surface 4b. The magnet 4 may be a rectangular solid and may have side surfaces 4c, 4c and end surfaces 4d, 4d. The facing surface 4a and the mounting surface 4b may be rectangular. The mounting surface 4b of the magnet 4 may be fastened to the rotating unit 2.

The magnet 4 may have a length L of approximately 15 mm along the side surfaces 4c, 4c and a width W of approximately 5 mm along the end surfaces 4d, 4d. The magnet 4 has a thickness T of approximately 2 mm defined between the facing surface 4a and the mounting surface 4b.

A revolution path $\Phi$ of the magnet 4 is illustrated in FIG. 1A. The revolution path $\Phi$ may be the course in which the center of gravity of the magnet 4, serving as a rectangular solid, revolves. A plane including the revolution path $\Phi$ may be a rotation plane orthogonal to the rotation axis O. The facing surface 4a and the mounting surface 4b of the magnet 4 may be located on planes parallel to the rotation plane.

Referring to FIGS. 1A and 1B, a detection substrate 5 may be fixed as a stationary member. The detection substrate 5 may have a detection surface 5a that may be disposed in a plane perpendicular to the rotation axis O and may be parallel to the rotation plane.

An angle detecting unit 10 and two position detecting units 20A and 20B may be fastened to the detection surface 5a of the detection substrate 5. The angle detecting unit 10 may be configured to detect a leakage magnetic field in the vicinity of the side surface 4c of the magnet 4 and produce a detection output based on a change in angle of rotation of the rotating unit 2 and the rotary shaft 3. In other words, the angle detecting unit 10 may detect an angle of rotation depending on the amount of pressing the brake pedal.

The position detecting units 20A and 20B may be positioned so that switch outputs are simultaneously changed when the rotating unit 2 and the rotary shaft 3 reach a predetermined position. The position detecting units 20A and 20B may be connected to different electric circuits. One of the switch outputs of the position detecting units 20A and 20B may be used, for example, to perform control for turning on a brake light on the back of the vehicle and the other one of the switch outputs may be used, for example, to perform control for releasing cruise control.

Figure 2:
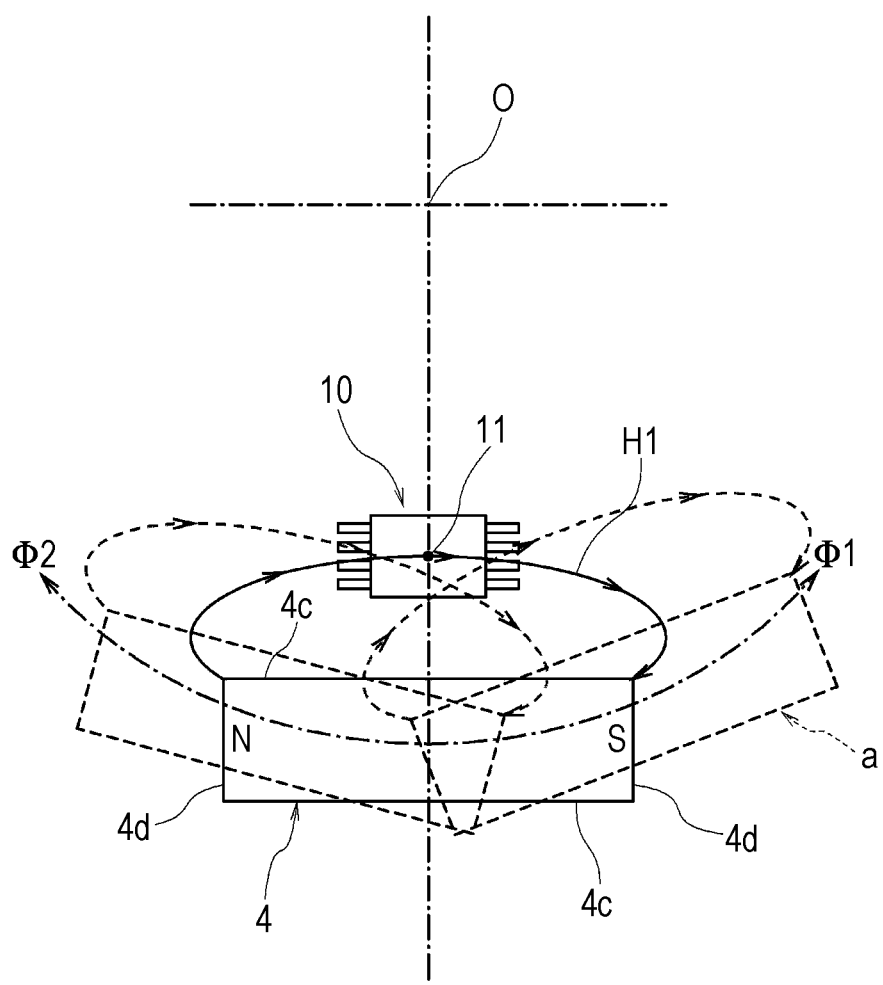
FIG. 2 is an enlarged front view of part of the rotation detector and illustrates the positional relationship between a magnet and an angle detecting unit.
Figure 8:
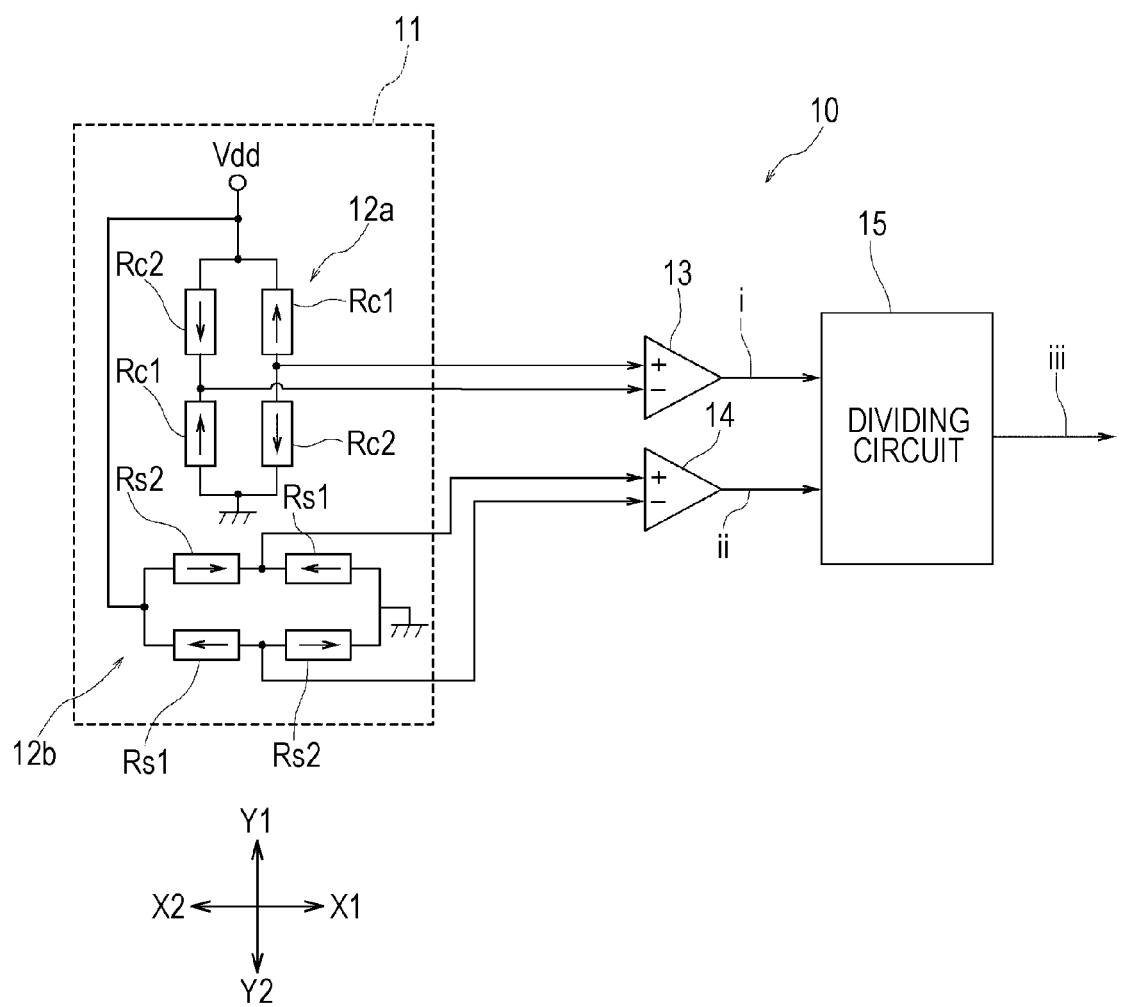
FIG. 8 is a circuit block diagram of the angle detecting unit in the embodiment.

Referring to FIGS. 1A and 2, the end surfaces 4d, 4d of the magnet 4 facing in a revolving direction may be magnetized to different magnetic poles opposite to each other. As illustrated in FIG. 8, the angle detecting unit 10 may include a sensor 11 that may include magnetoresistive elements, serving as magnetic detecting elements. The sensor 11 may be disposed adjacent to the side of the magnet 4. Specifically, the sensor 11 may be disposed farther away from the revolution path $\Phi$ than the side surface 4c of the magnet 4 in a radial direction of the revolution path $\Phi$.

As illustrated in FIG. 8, the sensor 11 may include a first bridge circuit 12a and a second bridge circuit 12b. The first bridge circuit 12a may include magnetoresistive elements Rc1 and Rc2. In FIGS. 1A and 8, an X direction and a Y direction may be illustrated on the basis of the same reference. The magnetoresistive elements Rc1 may have a sensing axis in a Y1 direction and the magnetoresistive elements Rc2 have a sensing axis in a Y2 direction. Outputs at two intermediate points of the first bridge circuit 12a are input to a differential amplifier 13.

The second bridge circuit 12b includes magnetoresistive elements Rs1 and Rs2. The magnetoresistive elements Rs1 may have a sensing axis in an X2 direction and the magnetoresistive elements Rs2 may have a sensing axis in an X1 direction. Outputs at two intermediate points of the second bridge circuit 12b may be input to a differential amplifier 14.

The magnetoresistive elements Rc1, Rc2, Rs1, and Rs2 are giant magnetoresistive (GMR) elements using the giant magnetoresistive effect or tunneling magnetoresistive (TMR) elements using the tunnel effect.

Each of the magnetoresistive elements may include a laminate including a fixed magnetic layer, a nonmagnetic layer, and a free magnetic layer. The fixed magnetic layer has a fixed magnetization direction that may coincide with the sensing axis direction. The orientation of magnetization of the free magnetic layer is changeable by an external magnetic field.

The magnetoresistive element has a resistance that depends on a relative angle formed by the fixed magnetization direction and the orientation of magnetization of the free magnetic layer. When an external magnetic field is applied in a direction parallel to the sensing axis, the magnetoresistive element has a minimum resistance. When the external magnetic field is applied in a direction antiparallel to the sensing axis, the magnetoresistive element has a maximum resistance. When the external magnetic field is applied in a direction orthogonal to the sensing axis, the magnetoresistive element has an intermediate resistance.

The fixed magnetization direction of the fixed magnetic layer may be obtained by disposing the fixed magnetic layer on an antiferromagnetic layer and subjecting the layers to heat treatment in a magnetic field. Also, the fixed magnetic layer may have a laminated ferrimagnetic structure including a magnetic layer, a nonmagnetic intermediate layer, and a magnetic layer and be of a self-pinned type in which the magnetization directions of the magnetic layers are fixed antiparallel to each other.

Referring to FIG. 2, a leakage magnetic field (leakage magnetic flux) H1 in the vicinity of the side surface 4c of the magnet 4 may be applied to the sensor 11 of the angle detecting unit 10. When the rotating unit 2 and the rotary shaft 3 rotate and the magnet 4 revolves on the revolution path Φ, the magnetization directions of the free magnetic layers of the magnetoresistive elements Rc1, Rc2, Rs1, and Rs2 may rotate in accordance with revolution of a component of the leakage magnetic field H1 parallel to the side surface 4c of the magnet 4.

Figure 10A:
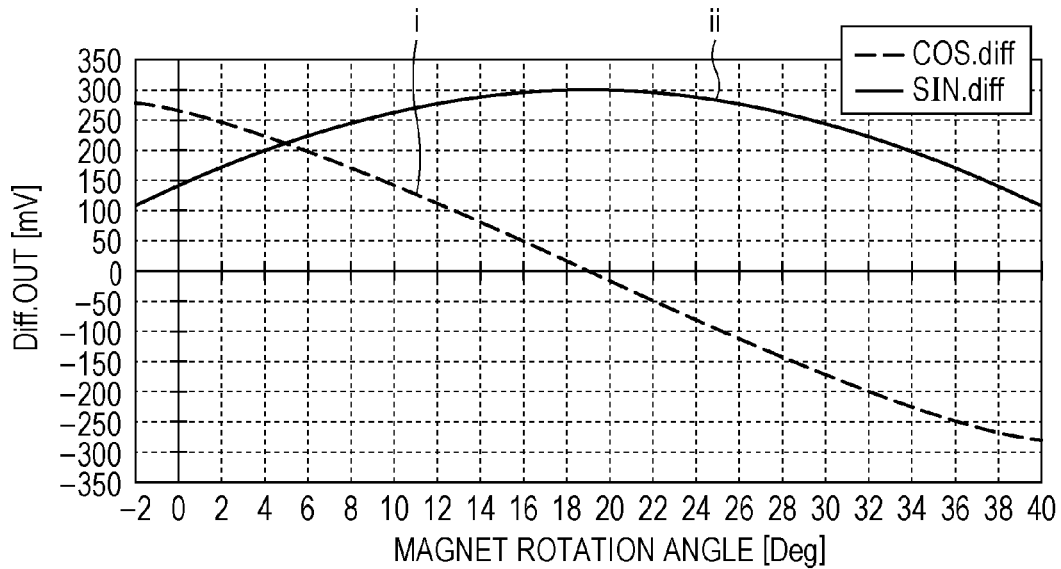
FIGS. 10A and 10B are graphs illustrating detection outputs of the angle detecting unit in the embodiment.

Consequently, the differential amplifier 13 may produce an output i illustrated in FIG. 10A and the differential amplifier 14 may produce an output ii illustrated in FIG. 10A. The outputs i and ii may approximate trigonometric function waves and may be 90 degrees out of phase. The output i may have a change which approximates a cosine wave and the output ii has a change which may approximate a sine wave.

Figure 10B:
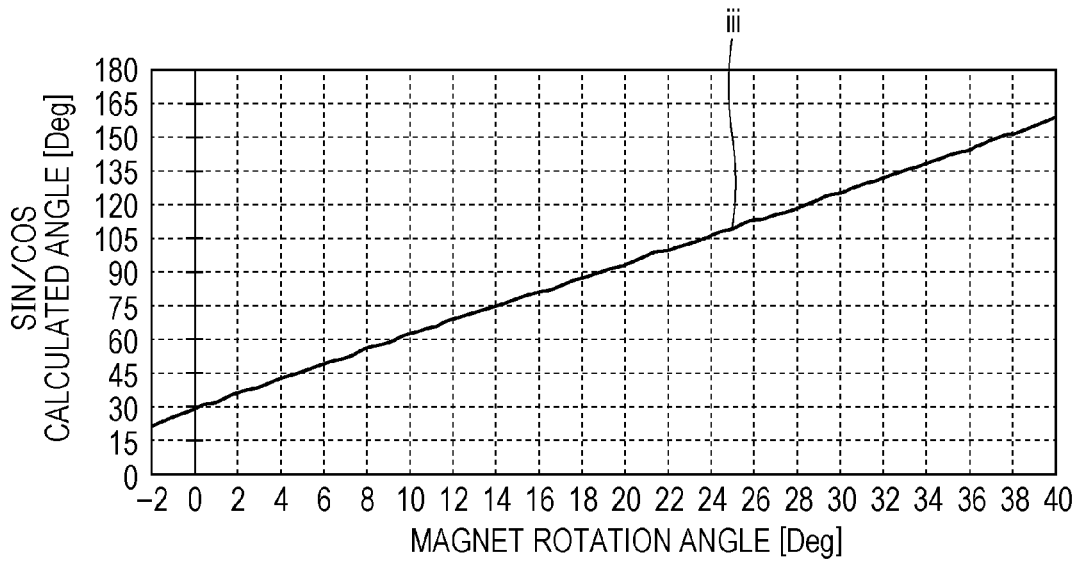

Referring to FIG. 8, the two outputs i and ii may be input to a dividing circuit 15 in the angle detecting unit 10. In the dividing circuit 15, the two outputs i and ii may be subjected to division in an analog or digital manner, thus producing an angle detection output iii having a change which approximates an arctangent illustrated in FIG. 10B. The angle detection output iii may be a substantially linear function which is proportional to the angle of revolution of the magnet 4. The amount of pressing the brake pedal can be determined based on the angle detection output iii.

Figure 3:
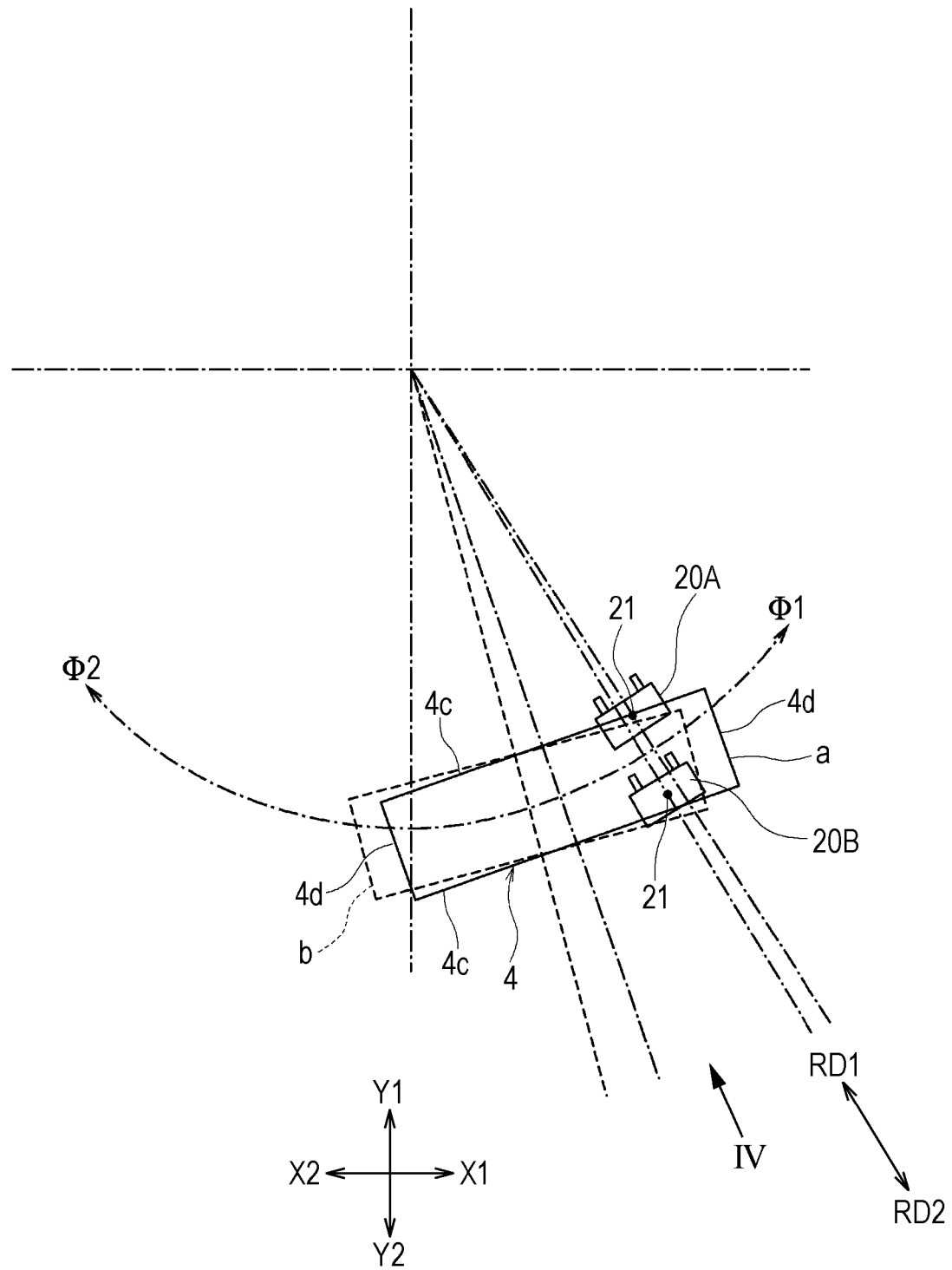
FIG. 3 is an enlarged front view of part of the rotation detector and illustrates the positional relationship between the magnet and two position detecting units.

When the magnet 4 is at a position a in FIGS. 2 and 3, the rotating unit 2 and the rotary shaft 3 may be located at an initial position and the angle of rotation of the rotating unit 2 and the rotary shaft 3 may be 0 degrees. For example, the rotating unit 2 and the rotary shaft 3 may be urged in a Φ1 direction to the initial position by spring force. When the brake pedal is pressed and the rotating unit 2 and the rotary shaft 3 rotate from the initial position a in a Φ2 direction by, for example, 9 degrees, the magnet 4 reaches a detection position b. At this time, both a switch output from the first position detecting unit 20A and a switch output from the second position detecting unit 20B simultaneously may be changed.

Figure 9:
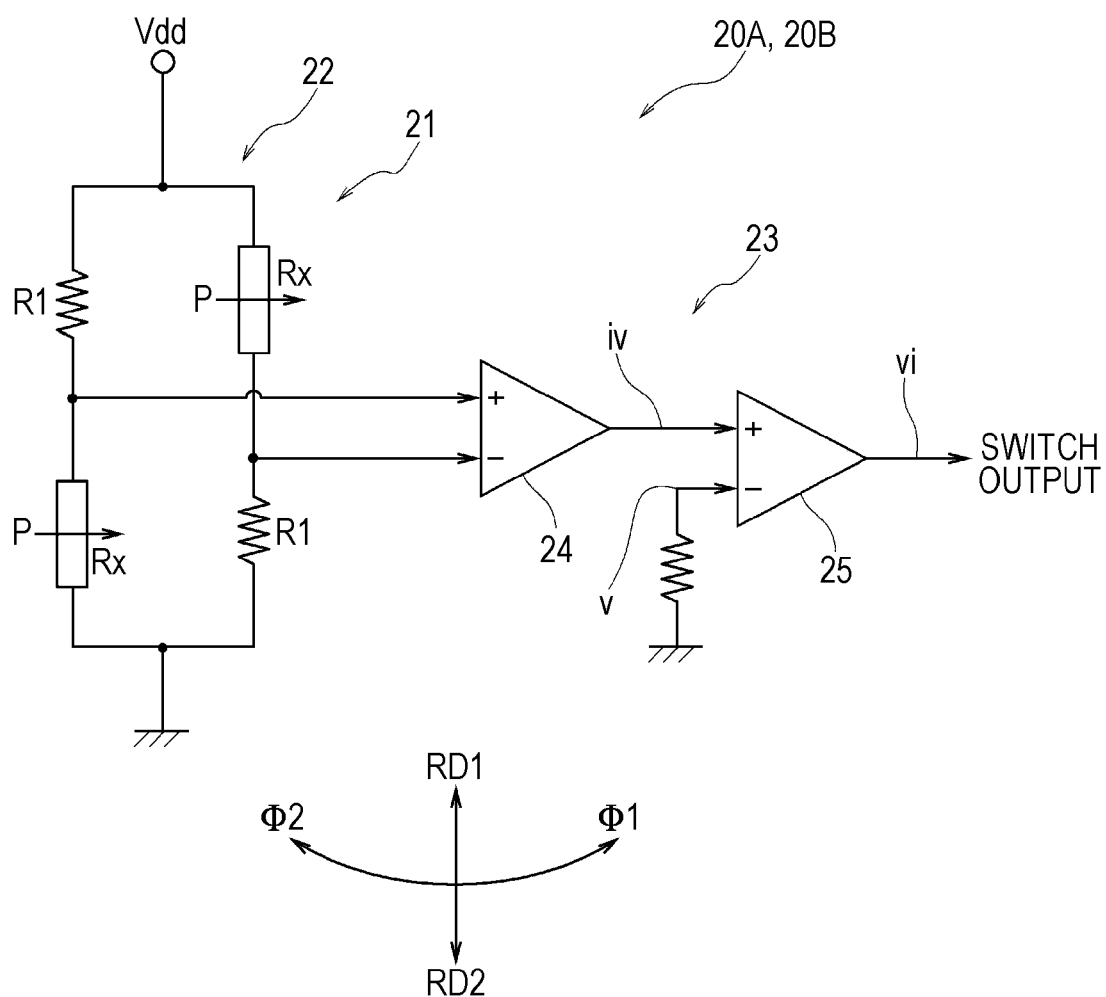
FIG. 9 is a circuit block diagram illustrating a switch circuit included in each of the position detecting units in the embodiment.

As illustrated in FIG. 9, the first position detecting unit 20A and the second position detecting unit 20B each may include a bridge circuit 22 and a switch circuit 23 that constitute a sensor 21.

In FIGS. 3 and 9, the revolution path Φ of the magnet 4 and a radial direction RD orthogonal to the revolution path Φ are illustrated on the basis of the same reference.

Figure 4A:
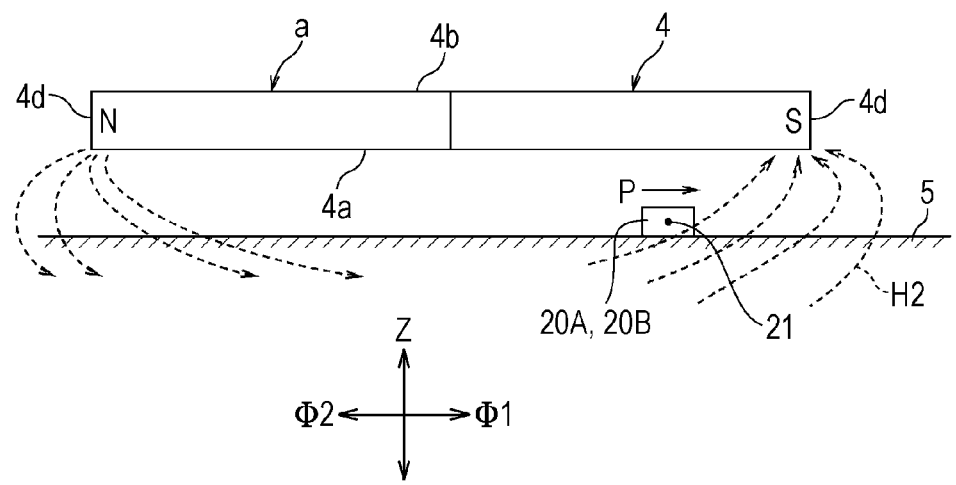
FIGS. 4A and 4B are enlarged bottom views of the rotation detector as seen in the direction of arrow IV of FIG. 3.
Figure 4B:
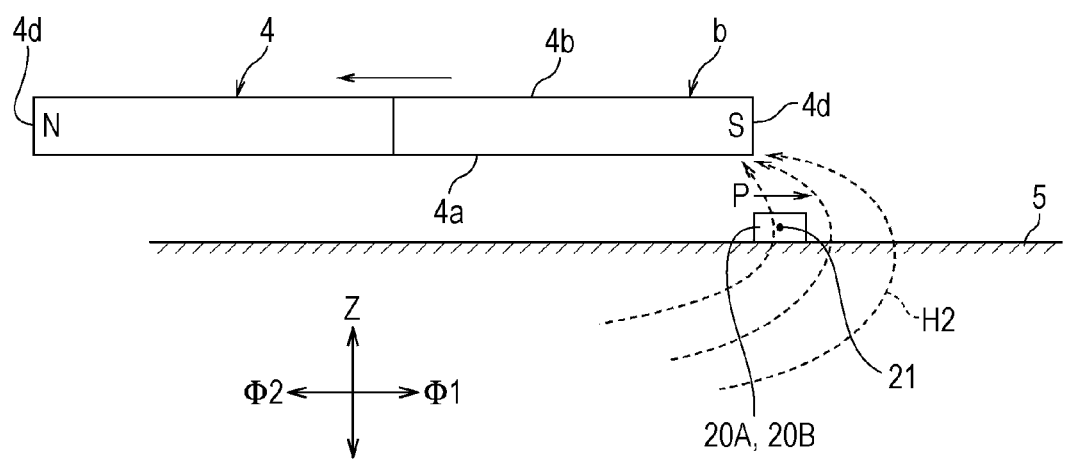

Referring to FIGS. 4A and 4B, the first position detecting unit 20A and the second position detecting unit 20B may be fastened so as to face the facing surface 4a of the magnet 4. The magnet 4 may have a leakage magnetic field H2 extending from the end surface 4d as the north pole through an area in front of the facing surface 4a to the end surface 4d as the south pole. The sensor 21 of each of the first and second position detecting units 20A and 20B may detect the leakage magnetic field H2.

As illustrated in FIG. 9, the bridge circuit 22 of each sensor 21 may include magnetoresistive elements Rx and fixed resistors R1. Referring to FIG. 4, a direction in which a sensing axis P of each magnetoresistive element Rx is oriented, namely, the orientation of fixed magnetization of the fixed magnetic layer is in the Φ1 direction. The magnetization of the free magnetic layer rotates in an XY plane.

Referring to FIG. 4A, when the magnet 4 is at the initial position a, a magnetic field component in the Φ1 direction may act on each magnetoresistive element Rx in the sensor 21 and the leakage magnetic field H2 may act so as to orient the magnetization of the free magnetic layer in the Φ1 direction. Referring to FIG. 4B, when the rotating unit 2 rotates in the Φ2 direction and the angle of rotation reaches 9 degrees, the magnet 4 may reach the detection position b. At this time, the leakage magnetic field H2 may act on the free magnetic layer of the magnetoresistive element Rx in a direction (Z direction) orthogonal to the sensing axis P of the magnetoresistive element Rx. When the magnet 4 passes the detection position b and further revolves in the Φ2 direction, the leakage magnetic field H2 may act so as to orient the magnetization of the free magnetic layer in the Φ2 direction.

As illustrated in FIG. 9, the switch circuit 23 of each of the first and second position detecting units 20A and 20B may include a differential amplifier 24. Outputs at two intermediate points of the bridge circuit 22 may be input to the differential amplifier 24. The differential amplifier 24 may produce a detection output iv illustrated in FIG. 11A during the revolution of the magnet 4 from the initial position a in the Φ2 direction.

Figure 11A:
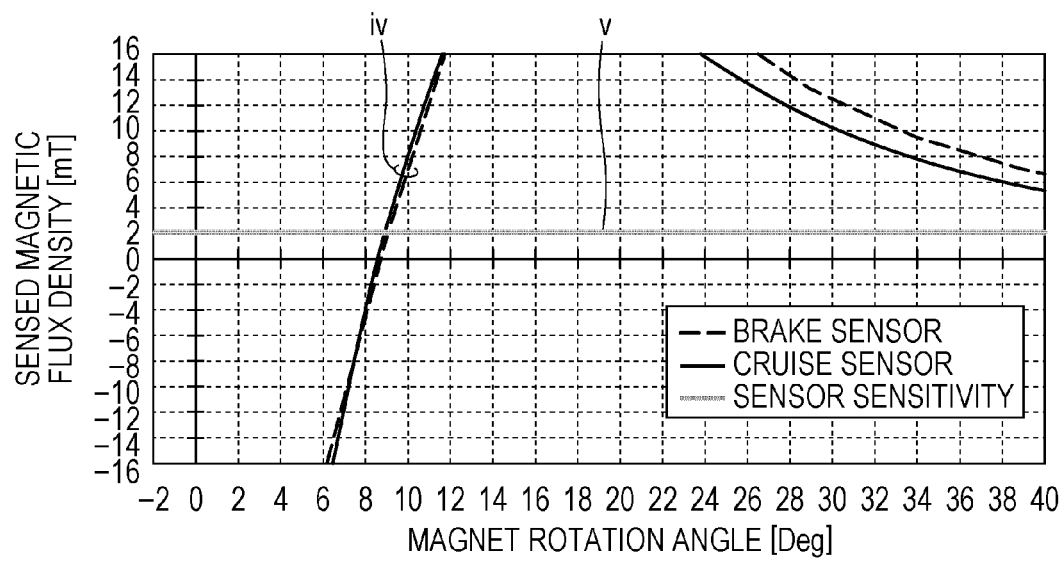
FIGS. 11A and 11B are graphs illustrating detection outputs of the position detecting units in the embodiment.
Figure 11B:
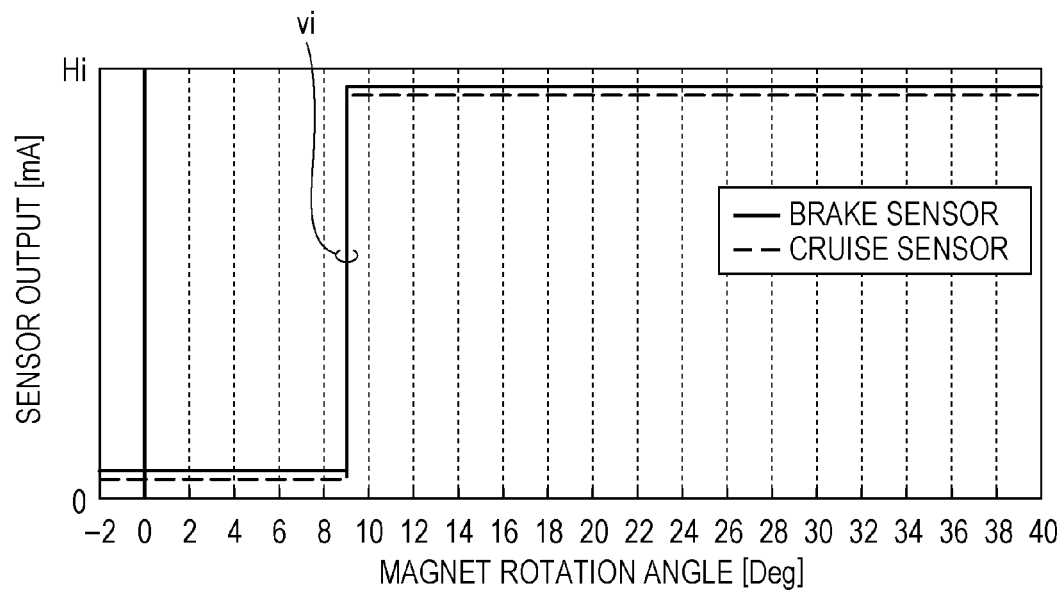

As illustrated in FIG. 9, the switch circuit 23 may include a comparator 25. The comparator 25 may compares the detection output iv to a threshold value v. As illustrated in FIG. 11A, the threshold value v may correspond to a detected voltage measured when a magnetic component in the Φ2 direction acting on the free magnetic layer is 2 mT. When the magnet 4 reaches the detection position b by revolving from the initial position a in the Φ2 direction by 9 degrees, a switch output vi produced by the comparator 25 may be inverted, or changed as illustrated in FIG. 11B.

In the rotation detector 1, the positions of the two position detecting units 20A and 20B may be adjusted and fixed so that when the angle of revolution, caused by pressing the brake pedal, of the magnet 4 from the initial position a in the Φ2 direction reaches 9 degrees, the switch outputs vi from the first and second position detecting units 20A and 20B are simultaneously inverted.

The switch outputs of the first and second position detecting units 20A and 20B may be simultaneously changed when the magnet 4 reaches the detection position b. Accordingly, both of the sensors 21 of the two position detecting units 20A and 20B cannot be arranged so as to face a center line Om that divides the magnet 4 into two halves in the width direction of the magnet 4. The sensors 21 may be arranged so as to be offset in the radial direction from the center line Om.

The influence of offset of the sensors 21 from the center line Om of the magnet 4 in the radial direction (or in the width direction of the magnet 4) will be described below on the basis of results of simulation.

The magnet 4 used in the simulation was a sintered neodymium magnet having a length L of 15 mm, a width W of 5 mm, and a thickness T of 2 mm. The distance in the Z direction between the facing surface 4a of the magnet 4 and the sensor 21 of each of the position detecting units 20 (hereinafter, used as a general reference numeral of 20A and 20B) was 2.5 mm.

As illustrated in FIGS. 4A and 4B, the switch outputs are changed when the two position detecting units 20A and 20B are in the vicinity of the end surface 4d of the magnet 4 in the Φ1 direction. Accordingly, the end surface 4d of the magnet 4 in the Φ1 direction has to be rectangular and flat. The end surface 4d of the magnet 4 in the Φ2 direction does not necessarily have to be rectangular.

Figure 12A:
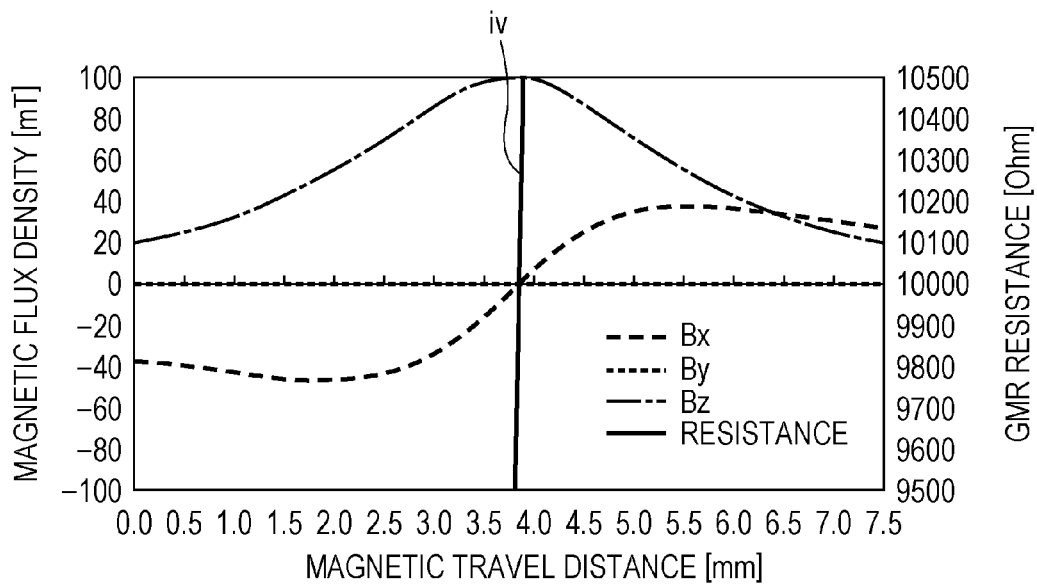
FIGS. 12A and 12B are graphs illustrating detection outputs of the position detecting unit in the embodiment.

FIG. 12A illustrates the intensities of magnetic field components acting on the sensor 21 of each position detecting unit 20 disposed so as to face the center line Om (refer to FIG. 5) that divides the magnet 4 moving on the revolution path Φ into two halves in the width direction of the magnet 4.

FIG. 12A illustrates changes of magnetic field intensities Bx, By, and Bz. In FIG. 12A, Bx denotes the intensity of a magnetic field component acting on the sensor 21, as illustrated in FIG. 4, in the X direction (the direction of a tangent to the revolution path Φ), By denotes the intensity of a magnetic field component acting on the sensor 21 in the width direction of the magnet 4 (in the Y direction, or the RD direction) illustrated in FIG. 5, and Bz denotes the intensity of a magnetic field component acting on the sensor 21 in the Z direction illustrated in FIG. 4.

As illustrated in FIG. 12A, when the magnet 4 revolves in a state in which the sensor 21 of the position detecting unit 20 faces the center line Om, the magnetic field component acting in the width direction (Y direction) of the magnet 4 hardly acts on the free magnetic layer of each magnetoresistive element Rx. The magnetic field intensity By is substantially zero. Accordingly, when the magnet 4 moves from the position a illustrated in FIG. 4A and passes the detection position b illustrated in FIG. 4B, the orientation of magnetization of the free magnetic layer is instantaneously reversed from the Φ1 direction to the Φ2 direction. FIG. 12A illustrates the detection output iv from the differential amplifier 24 at that time. The detection output iv has a steep change caused when the magnet 4 passed the detection position b.

Figure 5:
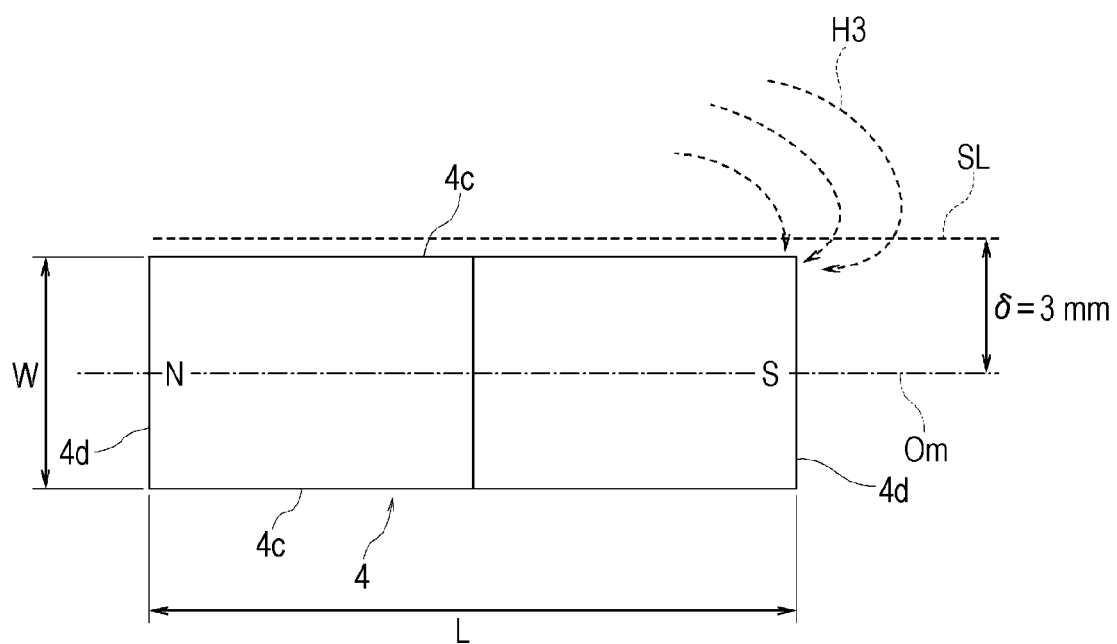
FIG. 5 is a front view of the magnet.
Figure 5:
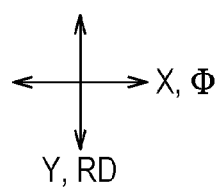
Figure 12B:
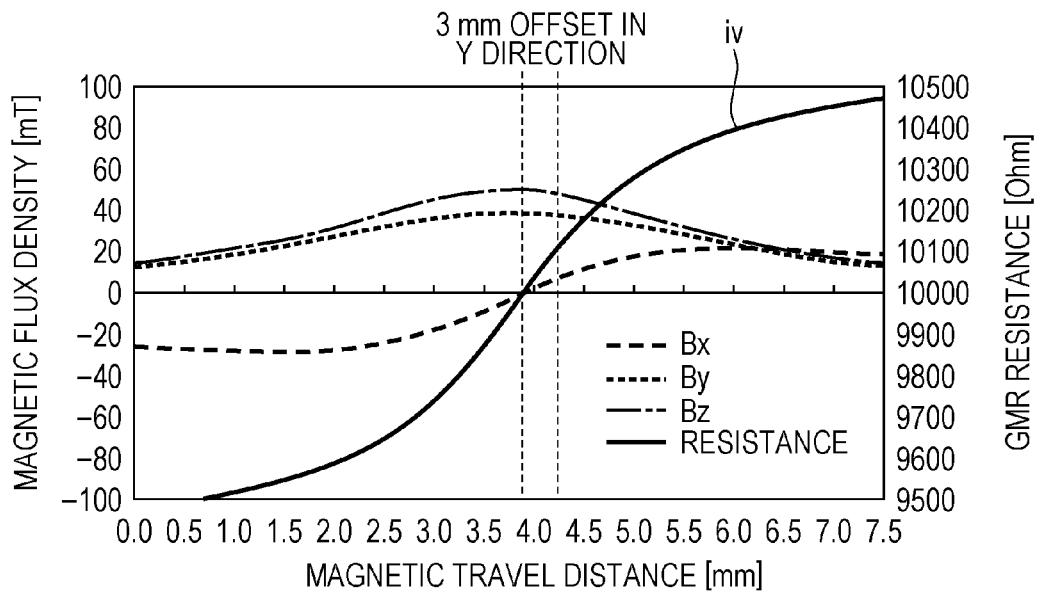

FIG. 5 illustrates an offset line SL that is offset in the Y direction from the center line Om of the magnet 4 by δ=3 mm. FIG. 12B illustrates changes in intensity of magnetic field components acting on the sensor 21 during movement of the magnet 4 in a state in which the sensor 21 of the position detecting unit 20 faced the offset line SL. In FIG. 12B, Bx, By, and Bz denote the intensities of the same magnetic field components as those in FIG. 12A.

While the sensor 21 faces the magnet 4 so as to be offset in the Y direction from the center line Om of the magnet 4 as illustrated in FIG. 5, a leakage magnetic field H3 in the vicinity of the side of the magnet 4 affects the magnetization of the free magnetic layer of each magnetoresistive element Rx in the sensor 21. Consequently, as illustrated in FIG. 12B, the sensor 21 is affected by both the magnetic field intensity Bx in the X direction and the magnetic field intensity By in the Y direction. The detection output iv from the differential amplifier 24 has a more gradual change than the detection output iv in FIG. 12A.

In FIG. 12B, assuming that a change in resistance corresponding to the threshold value v is approximately 0.5%, an error included in the travel distance of the magnet 4 traveling while the threshold value changes from 0% to 1% to cause variation before the switch output vi in FIG. 9 is inverted is approximately 0.3 mm.

Specifically, in the use of the rod-shaped magnet 4 having the end surfaces 4d, 4d, magnetized to the different magnetic poles, facing in the rotating direction, if the sensor 21 is allowed to face the magnet 4 such that the sensor 21 is offset in the Y direction from the center line Om of the magnet 4, an error included in the travel distance of the magnet 4 traveling while the intensity of the magnetic field component in the X direction is changed from 0 mT to 20 mT before the switch output vi is inverted can be reduced to a small value of approximately 0.3 mm. The influence of the magnetic field component in the Y direction on the sensor 21 can be minimized.

Figure 6:
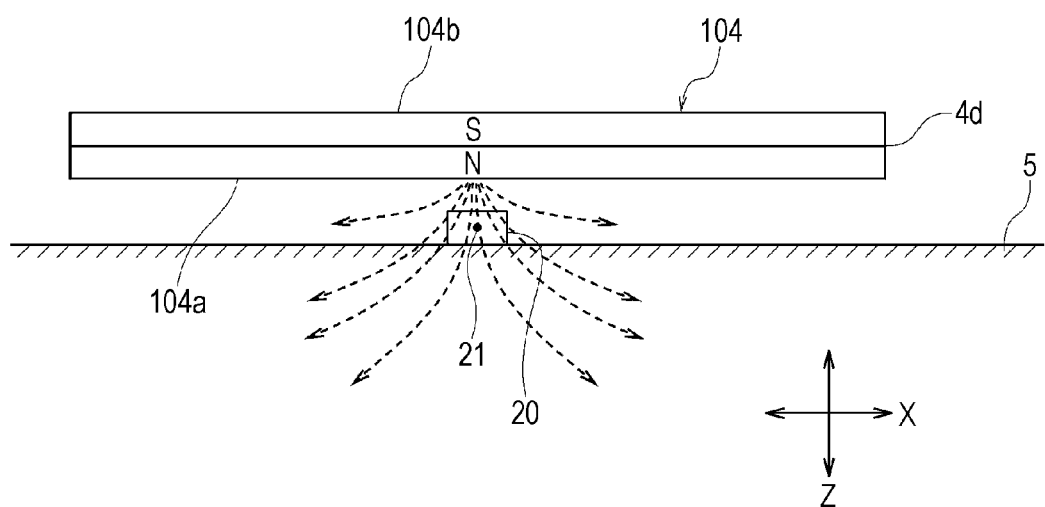
FIG. 6 is a bottom view of a rotation detector according to a comparative example and illustrates the positional relationship between a magnet and a position detecting unit.
Figure 7:
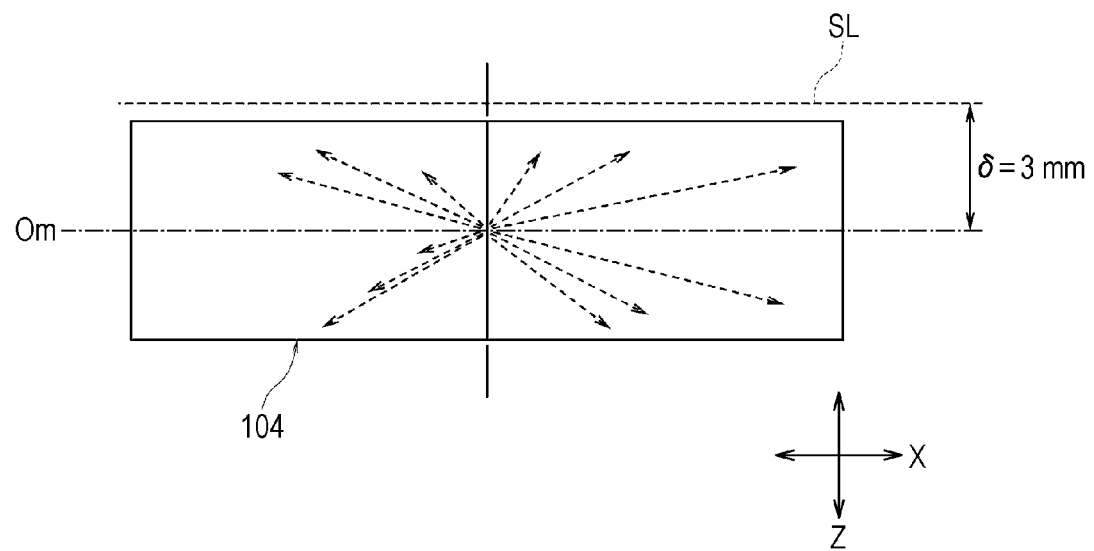
FIG. 7 is a front view of the magnet in the comparative example.

FIGS. 6 and 7 illustrate a comparative example. A magnet 104 used in the comparative example is magnetized such that a facing surface 104a and a mounting surface 4b have different magnetic poles opposite to each other. Referring to FIG. 7, magnetic lines of force in this magnetization radially extend from the centroid of the facing surface 104a, serving as the north pole, and converge to the centroid of the mounting surface 104b, serving as the south pole.

The magnetic lines of force radially extending from the centroid of the facing surface 104a cause a change in detection output iv in the arrangement in which the sensor 21 of the position detecting unit 20 faced the offset line SL 3 mm offset in the Y direction from the center line of the magnet 104 in the width direction thereof to be more gradual than that in the embodiment in FIG. 12B.

Figure 13A:
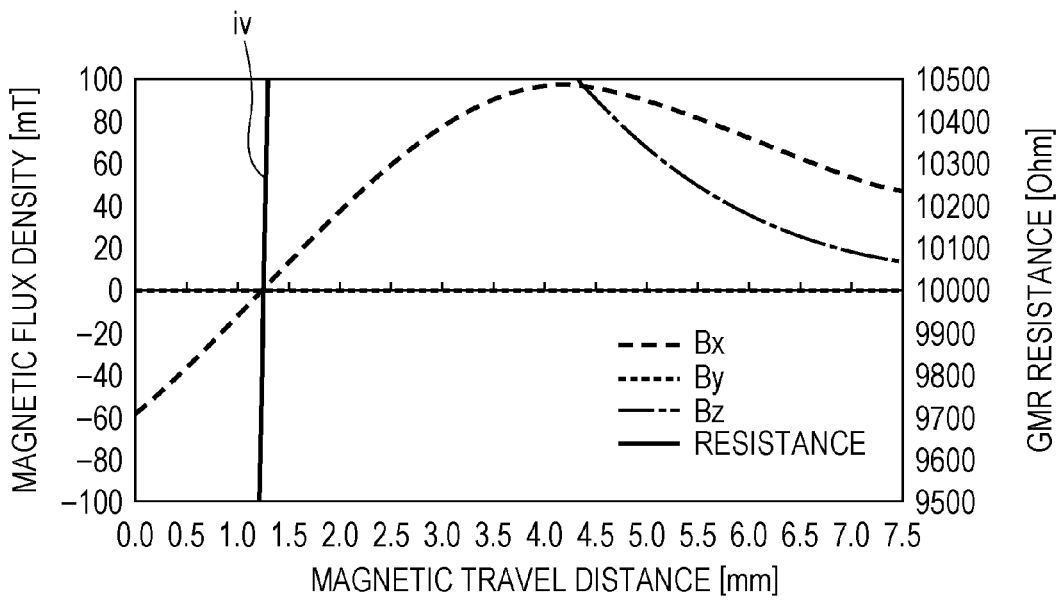
FIGS. 13A and 13B are graphs illustrating detection outputs of the position detecting unit in the comparative example.

FIG. 13A illustrates the intensities of magnetic field components acting on the sensor 21 in the comparative example in a state in which the sensor 21 of the position detecting unit 20 faced the center line Om of the magnet 104. In this case, the detection output iv from the differential amplifier 24 steeply changed when the magnet 104 passed the detection position b illustrated in FIG. 4B.

Figure 13B:
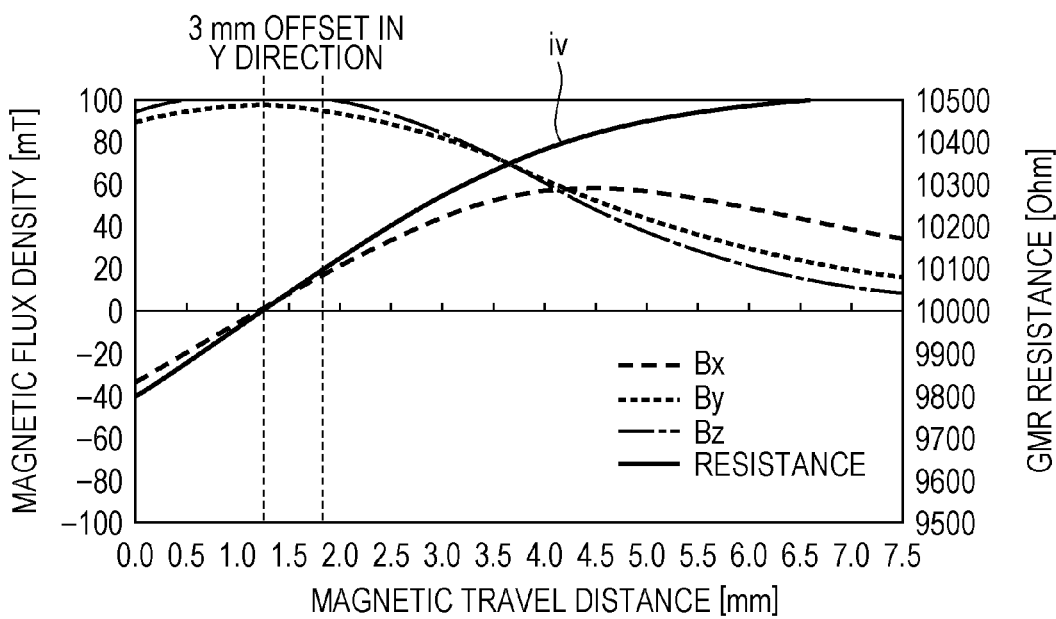

FIG. 13B illustrates the intensities of magnetic field components acting on the sensor 21 in the comparative example in a state in which the sensor 21 of the position detecting unit 20 faced the offset line SL offset in the Y direction from the center line Om of the magnet 104 by δ=3 mm. In this case, the detection output iv from the differential amplifier 24 exhibits an extremely gradual change. Assuming that a change in resistance corresponding to the threshold value v is approximately 0.5%, an error included in the travel distance of the magnet 104 traveling while the threshold value changes from 0% to 1% to cause variation before the switch output vi is inverted is increased to approximately 0.7 mm.

A comparison between FIGS. 12A and 12B and FIGS. 13A and 13B demonstrates the following: In the rotation detector 1 including the magnet 4 according to the embodiment illustrated in FIGS. 4A and 4B, if both of the two position detecting units 20A and 20B are offset in the Y direction from the center line Om of the magnet 4, the positions of the position detecting units 20A and 20B can be easily adjusted so as to produce the switch output vi at the same time. Since the magnet 4 is rectangular and the side surfaces 4c, 4c along the long sides are oriented in the direction of the tangent to the revolution path Φ and the end surfaces 4d, 4d oriented in the rotating direction serve as the different magnetic poles, the influence of the magnetic field component in the Y direction on the sensors 21 can be reduced in the arrangement in which the sensors 21 face the offset line SL as illustrated in FIG. 5.

On the other hand, in the magnet 104 in the comparative example, the magnetic field components radially extending from the centroid of the facing surface 104a tend to cause a time lag between the switch outputs vi from the two position detecting units 20A and 20B. It is difficult to position the two position detecting units 20A and 20B so that the units produce outputs at the same time.

The embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A rotation detector comprising:
    a rotating unit;
    a magnet disposed on the rotating unit;
    an angle detecting unit configured to detect a change in angle of rotation of the rotating unit by detecting a leakage magnetic field from the magnet; and
    at least one position detecting unit configured to operate when the magnet reaches a predetermined position,
    wherein the magnet has two end surfaces that are away from a rotation axis of the rotating unit and are oriented in a rotating direction and are magnetized to different magnetic poles, and has a flat surface parallel to a rotation plane including a rotation path of the rotating unit,
    wherein the angle detecting unit is disposed away from a revolution path of the magnet in a radial direction of the revolution path, the angle detecting unit includes a magnetoresistive element including a free magnetic layer, a direction in which magnetization of the free magnetic layer changes is set so as to be parallel to the rotation plane, and the magnetoresistive element is operable to detect a change in angle of rotation of the rotating unit, and
    wherein the at least one position detecting unit is disposed away from the flat surface of the magnet in a direction parallel to the rotation axis of the rotating unit and includes a magnetoresistive element and a switch circuit, the magnetoresistive element has a resistance that depends on a change in intensity of a magnetic field component parallel to a direction of a tangent to the revolution path, the magnetic field component is included in a leakage magnetic field in the vicinity of the flat surface of the magnet, and the switch circuit is configured to produce a switch output based on a change in the resistance.

2. The rotation detector according to claim 1,
    wherein the at least one position detecting unit comprises a plurality of position detecting units, and
    wherein the magnetoresistive elements included in the position detecting units are arranged so as to be offset in the radial direction from a center line that divides a width of the magnet into two halves in the radial direction.

3. The rotation detector according to claim 1, wherein the magnet is a rod-shaped rectangular magnet that has side surfaces along long sides and end surfaces along short sides and has a uniform thickness, the end surfaces are magnetized to different magnetic poles, and a longitudinal direction of the magnet is oriented in the direction of the tangent to the revolution path.

4. The rotation detector according to claim 1, wherein the at least one position detecting unit comprises two position detecting units and the position detecting units simultaneously produce switch outputs when the rotating unit rotates by a predetermined angle.

5. The rotation detector according to claim 4, wherein the angle detecting unit detects an amount of pressing a brake pedal of a motor vehicle, one of the switch outputs of the two position detecting units is used to perform control for turning on a brake light, and the other one of the switch outputs is used to perform control for releasing cruise control.

* * * * *